March 3, 1964 J. ANDRUS 3,122,817

FABRICATION OF SEMICONDUCTOR DEVICES

Original Filed Aug. 15, 1957 2 Sheets-Sheet 1

INVENTOR
J. ANDRUS
BY H. W. Lockhart

ATTORNEY

FABRICATION OF SEMICONDUCTOR DEVICES

Original Filed Aug. 15, 1957 2 Sheets-Sheet 2

1

3,122,817

FABRICATION OF SEMICONDUCTOR DEVICES

Jules Andrus, Berkeley Heights, N.J., assignor to Bell Telephone Laboratories, Incorporated, New York, N.Y., a corporation of New York Continuation of abandoned application Ser. No. 678,411, Aug. 15, 1957. This application Feb. 4, 1963, Ser. No. 255,918
3 Claims. (Cl. 29—25.3)

This invention relates to semiconductive translating devices and, more particularly, to methods and materials for producing intricate oxide masks on silicon semiconductive material by means of etch-resist techniques. This application is a continuation of my copending application Serial No. 678,411, filed August 15, 1957, now abandoned, and assigned to the same assignee as this application.

The application of L. Derick and C. J. Frosch, Serial No. 550,622, filed December 2, 1955, now Patent No. 2,802,760, discloses the method of masking the surface of a silicon semiconductive body by means of a surface oxide layer. This oxide layer, depending upon its thickness and the type of impurity diffusant used, inhibits the vapor-solid diffusion of an impurity into the silicon substrate. The above-noted application of Derick and Frosch sets forth those impurities susceptible of vapor-solid diffusion using an oxide mask on silicon. The impurity diffusion thus is limited to the unmasked areas and a semiconductive device may be produced having a plurality of regions of conductivity type opposite to that of the original material.

A principal object of this invention is to produce precise oxide mask patterns on semiconductive bodies. A further object is to produce semiconductive devices having complex diffused junction structures.

In accordance with one general aspect of this invention, it is made feasible to combine the precise masking techniques of the photoengraving art with the surface oxide masking principles described in the Derick-Frosch application by the use of a specific etchant which selectively attacks silicon dioxide. In my application, Serial No. 537,455, filed September 29, 1955, now abandoned, methods and materials are disclosed for producing precisely dimensioned and intricate metallic electrodes on crystalline bodies. The techniques of the photoengraving art are described therein for the production of precise photo-resist patterns on substrate materials. The present invention is based to a considerable extent upon the combination of certain of the techniques of my earlier above-identified application and of the Derick-Frosch application in conjunction with particular etchants.

In the past, it has been difficult to etch selected areas of the oxide layer on silicon to a desired masking pattern without, at the same time, removing portions of the photo-resist coating. It has, therefore, been impractical up to this time to utilize the precise masking techniques of the photoengraving art in combination with the highly advantageous silicon masking methods taught by Derick and Frosch.

Therefore, a feature of this invention is ammonium bifluoride etchants which selectively attack the surface oxide layer on silicon at a preselected rate without substantially affecting the resistant pattern applied thereon. A further feature of this invention is the use of successive resist and oxide masks for enabling multiple diffusion operations, thereby producing diffused structures having complex arrangements of differing conductivity or conductivity-type regions.

The invention and its other objects and features will be more readily understood from a consideration of the following description taken in connection with the drawing in which:

2

FIGS. 1A through 9A depict, in perspective, the processing of a silicon wafer in accordance with one method of this invention;

FIGS. 1B through 9B are corresponding cross-sectional views of the same silicon wafer; and FIG. 10 shows the finished silicon wafer in perspective and sectioned to show regions of differing conductivity type.

Figures 1A, 1B, 2A, 2B, 3A, 3B, 4A, 4B, 5A, 5B:
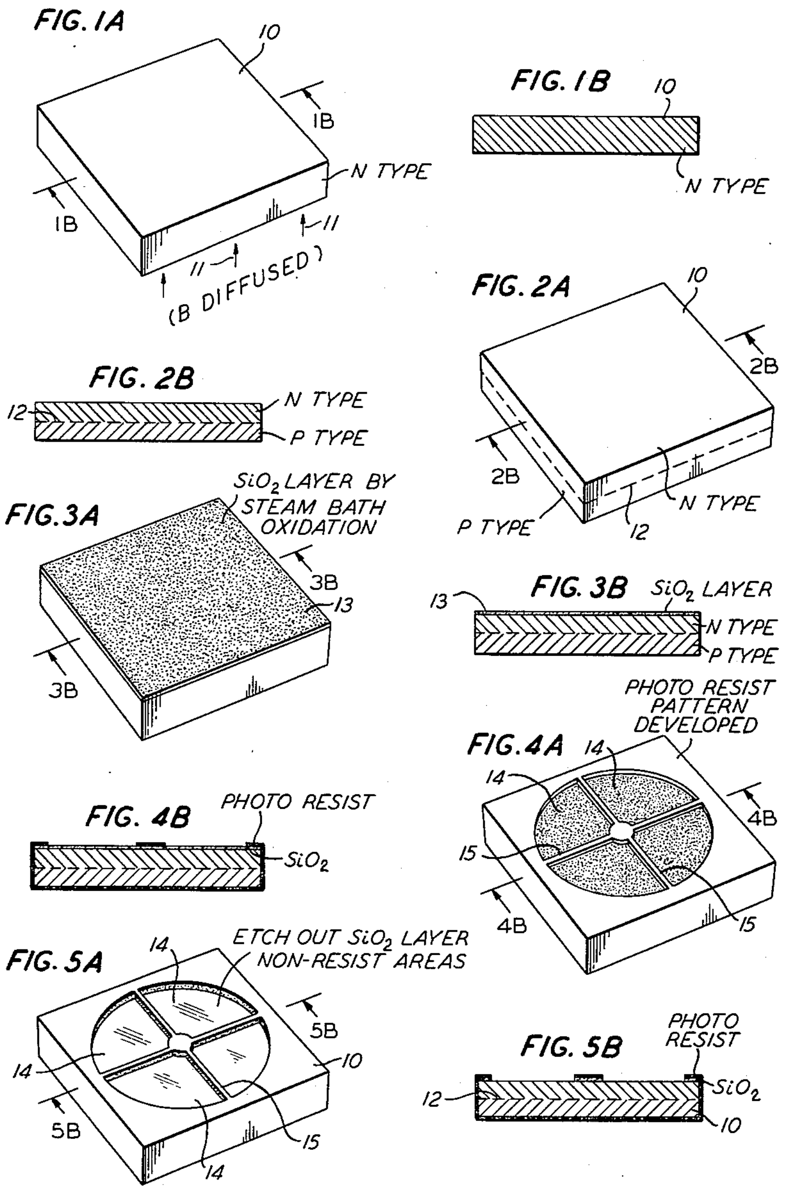

An appreciation of the particular advantages offered by the method of this invention may be had from a description of the method as used to produce a multiple junction stepping device of the general type disclosed in the application of I. M. Ross, Serial No. 516,521, filed June 20, 1955, now Patent No. 2,877,358. A device of this type may be fabricated from a single crystal silicon wafer 10, as shown in FIG. 1A, with dimensions of approximately 0.125 inch square and 0.01 inch thick. This wafer 10 may be produced in a variety of ways well known in the art and is suitably prepared by polishing and etching. As represented by the arrows 11 below the wafer 10 of FIG. 1A, the wafer is subjected to boron vapor diffusion, as disclosed, for example, in the above-identified application of Derick and Frosch, to produce a PN junction 12 within the wafer 10, as shown in FIGS. 2A and 2B.

In order to restrict the process to the formation of one junction, a mask is applied to all surfaces of the wafer 10 except the bottom face. Alternatively, if the entire wafer is exposed to the boron atmosphere the boron-diffused material must be removed from the surfaces other than the bottom face, for example, by etching. The silicon wafer then comprises an upper portion of N-type conductivity and a lower portion of P-type conductivity.

The wafer 10 is next subjected to an oxidizing treatment which will produce a layer 13 of substantially silicon dioxide ($SiO_2$) on the upper major face of the wafer, as shown in FIGS. 3A and 3B. This oxide layer 13 may be produced in a variety of ways as are disclosed also in the above-identified application of Derick and Frosch. The oxidation treatment may conveniently be limited to the upper major face of the wafer by suitable masking arrangements or the oxide film may be grown on the entire wafer and removed from the surfaces other than the upper face as shown. The desired thickness of this layer 13 will depend upon the particular diffusants and techniques which are to be employed. However, the optimum range of thickness is set forth generally in the Derick and Frosch application and the oxide layers used for the practice of this invention generally exceed 1,500 angstroms in thickness.

The oxide-coated face of the wafer 10 is next coated with a photographic-resist material which advantageously may be one of the compositions disclosed in Patents 2,670,285, 2,670,286, and 2,670,287 of Louis M. Minsk et al. Conventional methods of applying such a coating may be employed such as brushing, dipping, spraying, or the like which may be followed by a whirling operation to insure uniform and thin resist layers. It is important before applying the resist material to insure a clean surface by the use of suitable cleaning agents, for example, benzol, toluene, or like solvents.

The pattern is then photographically applied to the resist surface and is developed by means well known in the art, for example, as is also disclosed in my application noted hereinbefore. The configuration shown in FIG. 4A is the first step in the production of a semiconductor stepping device. As shown in FIGS. 4A and 4B, the resist has been removed by the photographic development process from a generally circular area which is divided into quadrants 14 by slender divisions 15 which may have a width of as little as 0.004 inch. It will be understood that the areas represented by the stippling are exposed portions of the oxide layer upon which no resist remains after development of the pattern.

The wafer 10 of FIGS. 4A and 4B is next subjected to the action of an etch solution on its upper face to remove the oxide layer from the areas which are unprotected by the photo-resist material. The result of this treatment is the structure shown in FIGS. 5A and 5B in which the silicon substrate is shown exposed in the four quadrants 14 formed by the resist pattern. As best seen in FIG. 5B, the oxide layer remains beneath the photo-resist pattern.

The most suitable etchants for accomplishing this step of the method comprise solutions of ammonium bifluoride. A particularly suitable solution which removes about 1,500 angstroms of the oxide per minute comprises as follows: 20 grams of ammonium bifluoride, crystal form, and 30 cubic centimeters of distilled water. This solution may also be made up in a paste form by boiling for five minutes and decanting when it is cooled to about 30 degrees centigrade. To this solution 50 cubic centimeters of animal glue of a viscous consistency and 10 cubic centimeters of glycerin are added. Various types of glue or adhesive materials may be used insofar as this additive contributes only to the viscosity of the paste. The mixture is then stirred vigorously until a homogenous mass is obtained. The paste form has about the same etching rate as the liquid solution and offers certain obvious advantages from the standpoint of controllability and handling in particular instances.

If a slower acting etchant is desired, a solution comprising 32 cubic centimeters of ammonium fluoride ($NH_4F$), which is formed by dissolving 20 grams of $NH_4F$, crystal form, in 30 cubic centimeters of distilled water, added to 5 cubic centimeters of hydrofluoric acid (HF), 48 percent concentration. This etchant removes about 300 angstroms of the oxide surface layer per minute.

The step of the method represented by the change in structure from FIG. 4A to FIG. 5A is an especially important part of the method of this invention. With the availability of an etchant or solvent having the selective capabilities set forth above, that is, one which attacks the oxide without removing the resist, the precise and highly resolved patterns produced by the methods of the photo-engraving art are readily transformed into an oxide mask of similar preciseness to enable the vapor-solid diffusion of significant impurities into certain selected areas.

Figures 6A, 6B, 7A, 7B, 8A, 8B, 9A, 9B, 10:
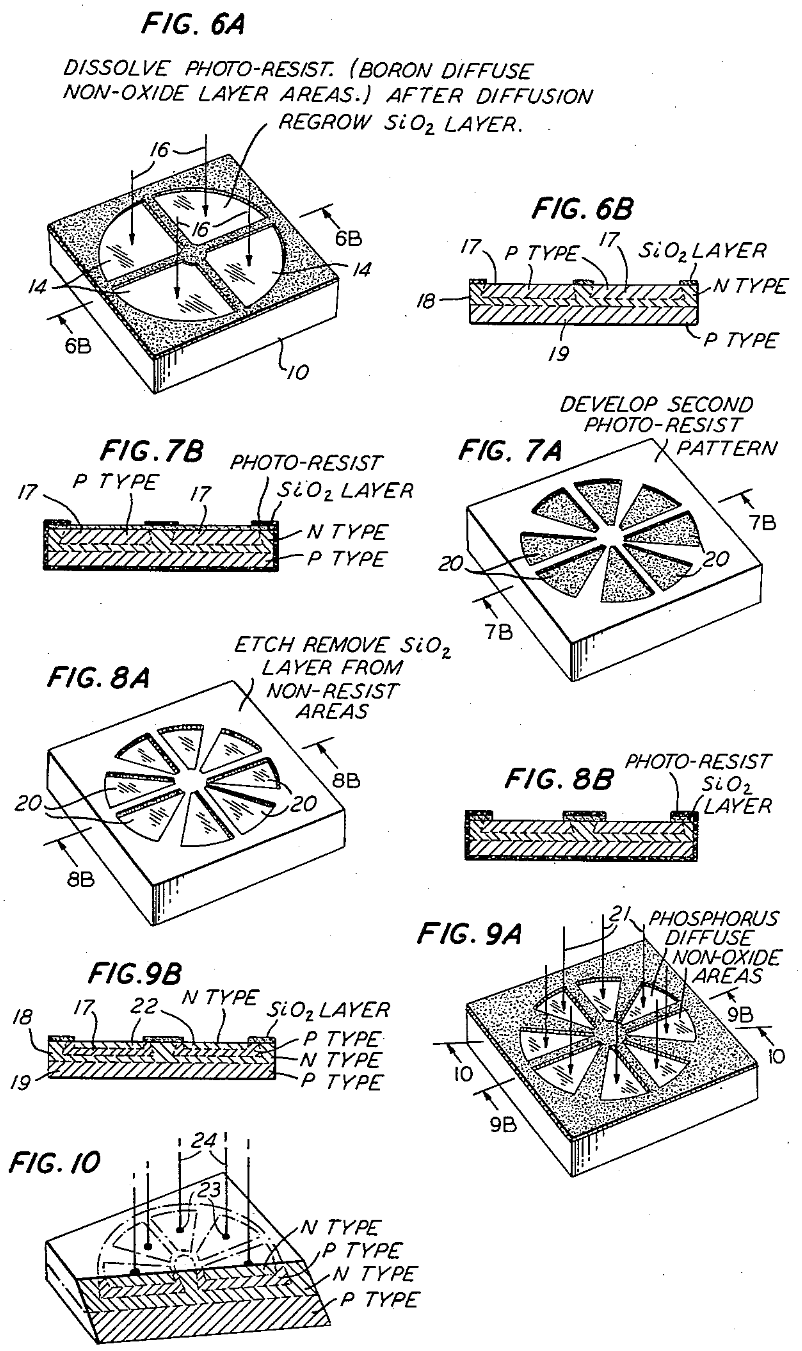

Turning now to FIG. 6A, the wafer is shown with the oxide mask covering those areas where diffusion is not desired. It is convenient to remove the photo-resist layer which had been superimposed upon the unetched oxide layer prior to treatments at elevated temperatures. This may be done by the use of any one of a number of suitable solvents, for example, Cellosolve acetate. The wafer of FIG. 6A is subjected to diffusion treatment in a boron atmosphere in accordance with the teachings of Derick and Frosch referred to heretofore. During this step, vapor diffusion of boron, as represented by the arrows, will occur over the areas 14 unprotected by the oxide layer and, depending upon the time and temperature used, P-type regions 17 will be formed under the unprotected areas which will conform very closely to the surface configuration of those unprotected areas.

As shown in FIG. 6B, a conductivity-type conversion will occur over a region extending downward to within several thousandths of an inch of the first PN junction formed in the wafer. A very slight spreading of the diffused regions may result but this may be compensated for by a proper dimensioning of the masked areas. At this stage of the process (FIG. 6B), a plurality of PNP structures having two common conductivity-type regions 18 and 19 has been produced.

It will be understood that other diffusants in addition to boron are suitable. However, certain significant impurities, for example, gallium, which are not masked appreciably by a surface oxide film are not usable for thie particular process. These characteristics are set forth in the aforementioned application of Derick and Frosch. Moreover, in some device structures the object sought in carrying out the diffusion process is not a conductivity-type conversion but rather may involve merely an increase or decrease in conductivity without change in type.

The next step in the process of producing a stepping device of the type comprising a plurality of PNPN structures is to regrow the oxide layer over the entire upper major face of the wafer. Then, as shown in FIGS. 7A and 7B, a second photo-resist pattern is developed upon the regrown oxide layer. This second pattern comprises a design in the form of eight petals 20 generally arranged within the quadrant design of the first pattern but of lesser area. The steps involved in producing the first oxide film mask are then repeated, as shown in the figures which follow.

In FIGS. 8A and 8B, the wafer is shown after the oxide etchant has been applied to remove the nonresist covered areas of the upper face of the wafer.

Then, in FIGS. 9A and 9B, the wafer is shown with the second oxide layer pattern as it appears preliminary to the next diffusion treatment.

In the final step of the process, the wafer of FIG. 9A is subjected to a phosphorus diffusion treatment represented by the arrows 21, thereby producing limited regions 22 of N-type conductivity corresponding to each of the petal areas shown. In FIG. 9B, the silicon semiconductive body now consists of eight surface regions 22 of N-type conductivity, of four P-type regions 17 adjacent thereto and extending therebeyond, an intermediate N-type region 18 extending across the entire wafer and a P-type base region 19 likewise extending across the entire wafer. It is possible thus to provide a silicon wafer in which the separation between the peripheries of the various diffused regions may be as low as one or two-thousandths of an inch. This facility coupled with the ability to diffuse to depths controllable to within the order of one ten-thousandth of an inch enables the production of complex, precisely dimensioned semiconductive devices.

The final form of the device is depicted in FIG. 10 in which the wafer has been sectioned at an angle to enlarge, in effect, the different conductivity-type regions. The petal members of the pattern have been shown in outline to facilitate an understanding of the utilization of the semiconductor device. They would not, however, appear as such unless the surfaces were etched and treated to display the PN junctions. Electrical contacts 23 and leads 24 are shown to the N-ytpe regions 22. A base contact, not shown, may be made to the region 19.

In one specific example in accordance with the process of this invention, a single crystal silicon wafer 0.125 inch square and 0.01 inch thick and having a resistivity of 0.2 ohm-centimeter N-type conductivity and a surface concentration of impurity centers of about $10^{17}$ per cubic centimeter was cleaned by etching and placed in a tube-type diffusion furnace. The wafer was heated at 1300 degrees centigrade for about 14 hours in a boron atmosphere which resulted in the formation of a P-type layer having a thickness of about 0.0025 inch on all surfaces of the wafer.

This P-type layer was removed from all surfaces except one major face by mechanical lapping. In addition, on the other major face lapping was continued until the wafer had a total thickness of 0.004 inch, thus placing the PN junction in a plane 0.0025 inch from the bottom face and 0.0015 inch from the top face. At this juncture the surface concentration of impurity centers in the P-type zone was about $10^{20}$ per cubic centimeter.

The clean wafer was positioned again in a tube-type furnace and subjected to an oxidizing mixture comprising hydrogen which had been bubbled through deionized water. The wafer was heated at 1200 degrees centigrade for 30 minutes which produced an oxide layer on the wafer of about 2,000 angstroms thick.

The wafer was then thoroughly cleaned in toluene and dried. A coating of Kodak photo-resist was then sprayed on all surfaces of the wafer. This resist was compounded of the following materials: polyvinyl cinnamate, 2.5 grams; methyl glycol acetate, 100 cubic centimeters; perinaphthenone sensitizer compound, 0.25 gram. In accordance with the photographic technique of the photoengraving art as generally set forth in method II of my patent application supra, the pattern shown in FIG. 4A was produced in the photo-resist coating on the upper major face of the wafer.

After the photo-resist coating had dried and hardened the wafer was placed in an etching solution of ammonium bifluoride comprising 20 grams of the crystal form of the bifluoride compound dissolved in 30 cubic centimeters of distilled water. After two or three minutes in this solution the exposed oxide was completely dissolved and the wafer was removed, washed in Cellosolve acetate to remove the photo-resist coating, then thoroughly washed in deionized water, and dried.

The wafer, in the form shown in FIG. 6A, was positioned again in the diffusion furnace and subjected to a boron atmosphere at a temperature of 1300 degrees centigrade for about three hours. This treatment produced a P-type conductivity layer 0.0006 inch thick on the exposed quadrants of the upper face of the wafer, as illustrated by the P-type regions 17 of the drawing. The surface concentration of impurity centers of these P-type regions was about $6\times10^{18}$ per cubic centimeter.

The wafer was subjected again to the oxidation treatment, as described above, to regrow the oxide layer on all surfaces of the wafer. The application of the thin, uniform photo-resist coating was repeated and the pattern of FIG. 7A was produced on the upper face of the wafer.

The wafer was etched again in the ammonium bifluoride solution to dissolve the unmasked oxide layer thereby producing the configuration shown in FIG. 8A. Following removal of the oxide layer from the petal areas, the entire photo-resist coating was removed and the wafer again was placed in a diffusion furnace. A diffusion treatment was then carried out using a vapor of phosphorus pentoxide at a temperature of 1200 degrees centigrade for about one hour. This treatment produced a plurality of N-type conductivity regions conforming to each of the petal areas from which the oxide mask had been removed. The penetration of the P-type zones was about 0.0003 inch deep.

The remaining oxide film was then removed from the wafer surfaces and after etching and cleaning the wafer was subjected to final processing including attachment of electrodes to the various conductivity-type regions. The final device was operated in an electrical circuit in accordance with the teachings of the aforenoted application of I. M. Ross.

Although the method of this invention has been set forth in terms of etching out the oxide layer to produce an oxide mask for vapor-solid diffusion, it will be apparent that another useful form of this invention consists in first predepositing or diffusing a very thin heavily doped impurity region on the wafer surface, followed by the step of growing a silicon oxide film thereon. The method then continues, as described heretofore, with the production of a photo-resist pattern but the etching processes are extended to include removal not only of the unmasked silicon oxide layer using the etchants disclosed hereinbefore but also removal of sufficient of the silicon substrate using a different selective etchant to eliminate all of the predeposited or prediffused material which is not masked. A suitable etchant for removing silicon may comprise two cubic centimeters of a silver nitrate solution made up of one gram of silver nitrate in 100 cubic centimeters of distilled water, two cubic centimeters of nitric acid, and one-half cubic centimeter of hydrofluoric acid. This etchant removes about 0.0002 inch of silicon per minute.

The photo-resist and oxide may then be removed and the wafer heated to diffuse in the predeposited or prediffused impurity from those areas which were masked and have not been etched away. In accordance with this latter technique, the photo-resist pattern itself would represent the diffusion pattern and thus would represent a "positive" rather than a "negative," as was the case in the basic process disclosed.

While specific embodiments of this invention have been shown and described, it will be understood that they are but illustrative and that various modifications may be made therein without departing from the scope and spirit of the invention.

What is claimed is:

1. The method of making semiconductor devices comprising the steps of forming an oxide coating on a surface of a semiconductor body, removing said oxide coating from a first limited area of said semiconductor body thereby exposing said limited surface area, diffusing into the thus exposed limited surface area a first impurity forming within the semiconductor body a P–N junction extending to the semiconductor surface underneath said coating, reforming an oxide coating on the semiconductor surface over said exposed limited surface area, removing from the reformed oxide coating a second limited area less than said first limited area thus exposing a smaller limited surface area of the semiconductor body thereunder, and diffusing into said smaller limited surface area of said semiconductor body a second impurity forming within the semiconductor body between the previously formed junction and the surface thereof another P–N junction extending to the semiconductor surface underneath the reformed coating.

2. A method in accordance with claim 1 wherein the removal of the oxide coating from said first and second limited areas of said semiconductor body is accomplished by photoresist techniques.

3. A method in accordance with claim 1 including the added steps of removing the oxide coating, and thereafter attaching separate contacts to said first and second surface areas.

References Cited in the file of this patent

UNITED STATES PATENTS

| | | |
|---|---|---|
| 2,411,298 | Shore | Nov. 19, 1946 |
| 2,506,604 | Lokker et al. | May 9, 1950 |
| 2,802,760 | Derick et al. | Aug. 13, 1957 |
| 3,025,589 | Hoerni | May 20, 1962 |